United States Patent [19]

Wade et al.

[11] Patent Number: 4,831,585
[45] Date of Patent: May 16, 1989

[54] FOUR TRANSISTOR CROSS-COUPLED BITLINE CONTENT ADDRESSABLE MEMORY

[75] Inventors: Jon P. Wade, Boston; Charles G. Sodini, Cambridge, both of Mass.

[73] Assignee: Massachusetts Institute of Technology, Cambridge, Mass.

[21] Appl. No.: 115,585

[22] Filed: Oct. 26, 1987

Related U.S. Application Data

[63] Continuation of Ser. No. 802,571, Nov. 27, 1985, abandoned.

[51] Int. Cl.$^4$ .............................................. G11C 15/00
[52] U.S. Cl. ........................................ 365/49; 365/174
[58] Field of Search ........................... 365/49, 174, 189

[56] References Cited

U.S. PATENT DOCUMENTS

| | | | |
|---|---|---|---|
| 3,701,980 | 10/1972 | Mundy | 365/188 |
| 3,969,707 | 7/1976 | Lane et al. | 365/49 |
| 4,291,391 | 9/1981 | Chatterjee et al. | 365/184 |
| 4,507,758 | 3/1985 | Moeschwitzer | 365/182 |
| 4,538,243 | 8/1985 | Zehner | 365/49 |
| 4,646,271 | 2/1987 | Uchiyama et al. | 365/49 |

OTHER PUBLICATIONS

J. C. Hou, "CAM Cell for Use in Hybrid Memory Scheme", IBM Technical Disclosure Bulletin, vol. 26, No. 8, Jan. 1984, pp. 4331–4334.

*Primary Examiner*—Joseph A. Popek
*Attorney, Agent, or Firm*—Hamilton, Brooks, Smith & Reynolds

[57] ABSTRACT

A content addressable memory cell comprises two storage IGFETs connected between a Match line and respective bitlines. Stored potentials are applied to the gates of the IGFETs through Write IGFETs which are cross coupled to the bitlines. The cross-coupling results in a larger storage capacitance and reduced degenerative capacitive coupling. This improves the speed and noise immunity of the cell. The memory cell is fabricated with three primary levels: a lower level of semiconductor material in which the source, drain and channel of each FET is formed, a center level of conductive material in which the Match and Write lines and the gates of the FETs are formed and an upper level in which the bitlines are formed. The center and lower levels are interconnected at buried contacts.

15 Claims, 5 Drawing Sheets

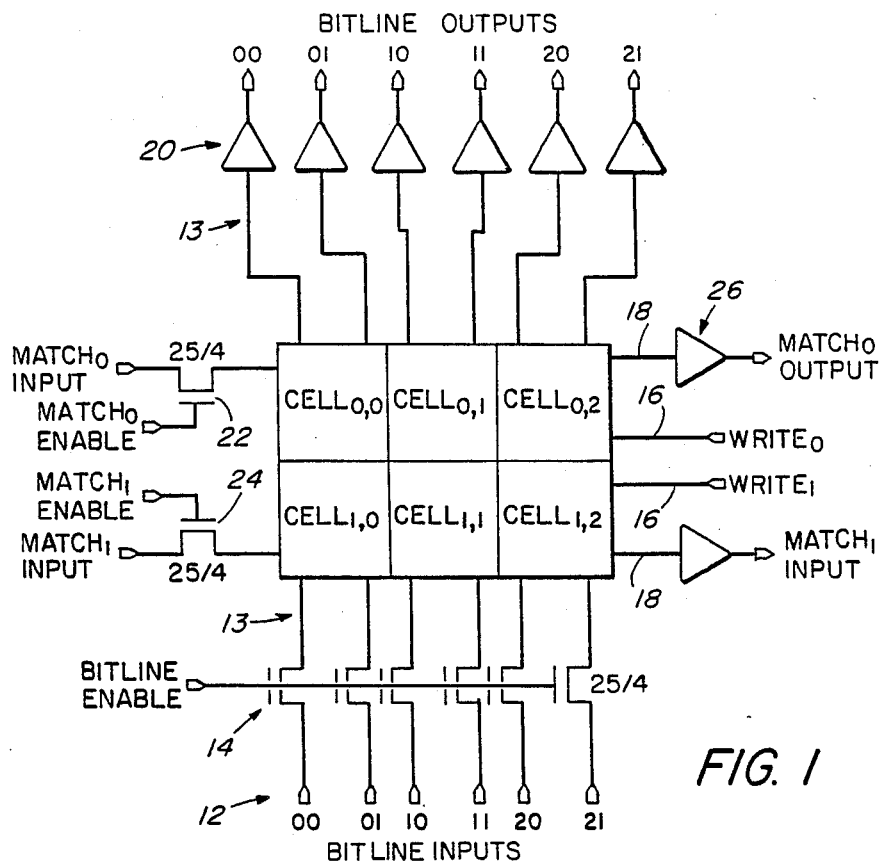
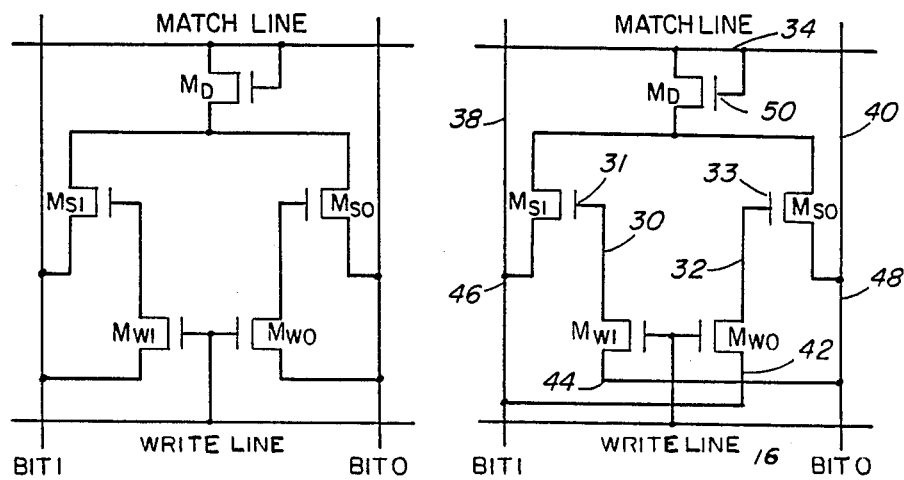
FIG. 2
FIG. 3

FOUR TRANSISTOR CROSS-COUPLED BITLINE CONTENT ADDRESSABLE MEMORY

This is a continuation of co-pending application Ser. No. 802,571 filed on Nov. 27, 1985, now abandoned.

BACKGROUND

The computational power achieved in modern general-purpose computers is primarily attributed to the high switching speed and small signal delays of the semiconductor microcircuits, whereas the structure of their basic architectures has remained relatively unchanged. The conventional von Neumann computer architecture suffers from a serious fundamental handicap which is due to its method of addressing memory. Memory is accessed serially by location, and that addressing approach consumes a great deal of time and leaves a vast proportion of the memory hardware idle. Also, much time is spent on purely searching and sorting tasks needed for memory management. One alternative is to use Content-Addressable Memories (CAMs) in a computational data base.

A content-addressable memory is defined to be a storage device that stores data in a number of cells which can be accessed or loaded on the basis of their contents. In its simplest form, a CAM can be used to store and access data according to address location and also to determine the address location of presented data. These are the Write, Read, and Search operations, respectively. The memory can be made more powerful by incorporating additional logic whereby a "don't care" state, as well as the "1" and "0" states, can be presented to the CAM so that certain bits can be masked from the search operation. Additional flexibility results from the ability to store the "don't care" state in the memory itself. Content-addressable memories which have provisions for the internal masking are named functional memories.

For speed and simplicity, all cells are compared simultaneously in parallel, and a single mismatch on any of the cells signals a mismatch for the entire word. With the parallel approach, the data must be stored such that a search operation will not destroy it. To do this, the data should be stored on an active device in such a way that when a "mismatch" is presented, the device changes its output while retaining its state.

The storage can be achieved in a number of ways. Presently, however, insulated gate field effect transistor (IGFET) technologies are most attractive when density, speed, power dissipation and cost are taken into account. It is convenient to build the memory cell and the support circuitry in the same technology. Therefore, the active device of greatest interest is the IGFET. At a minimum, the cell needs to be able to signal exact matches or mismatches, as well as have the capability to be externally masked. Therefore, three possible states must be presented to it, requiring two bitlines in a binary system. Since the IGFET is an unidirectional device and there are two bitlines which need to be compared, at least two active devices are needed. In summary, the minimum requirements for an IGFET CAM cell are: (1) two FETs to store data, (2) two bitlines for '1', '0', and "don't care" comparisons, (3) and output line to signal a match or mismatch, and (4) a means to store charge on the gates of the two FETs.

In the usual CAM cell design there are two bitlines that run vertically through all the words in the column; those bitlines are used both to carry data to be written into the cells and to present data against which a match is to be made. A Match line runs horizontally connecting an entire word and serves as a wired-or for mismatches. The Match line remains high if each cell in the CAM word matches the presented data on the bitlines. Conversely, if any cell in the word mismatches the presented data, the Match line is discharged to a lower potential. The Match line is also used to read the CAM word during the refresh operation. A Write line passes through each cell in a word to provide a means for isolating all but the words from a write cycle.

One CAM cell design is presented by Joseph L. Mundy in U.S. Pat. No. 3,701,980 and is shown here in FIG. 2. To write to this cell, the data is stored in the $M_S$ transistors and is accessed using the $M_W$ transistors. Writing is accomplished by choosing a particular word, raising its Write line to a high potential, and driving the desired logic levels on the bit 1 and bit 0 lines. The $M_W$ transistors are turned on by the Write signal to allow the gates of the $M_S$ transistors to be charged or discharged through the bit lines. A logic level "1" for the cell might be recognized as a high potential on $M_{S1}$ and a low potential on $M_{S0}$. A logic "0" would be the inverse; a low potential on $M_{S1}$ and high potential on $M_{S0}$. An internal "don't care" mask can be made by discharging both $M_S$ transistor gates.

Searching is accomplished by holding the Match line at a high potential while the bitlines are moved to their desired potentials. If a bitline is lowered on a branch where a high potential is stored on the $M_S$ transistor, current flows from the Match line through the "on" $M_S$ transistor to the bitline and a mismatch is detected. For example, if $M_{S1}$ has a high potential stored on its gate and is thus "on" and the bit 1 line is lowered, current flows from the Match line. If no current flows from any of the bits in a word, a match is detected.

Addressed Reading is required to refresh the cell and is accomplished by keeping the Write line and the two bit lines at ground and raising the potential of the Match line for a specific word. Current then flows on a bit line if it is on a branch with a high potential stored on the $M_S$ transistor. It is interesting to note that the search and read cycles are essentially the same except that the roles of the Match and bit lines are interchanged. Refresh is accomplished using a word-by-word Read and Write refresh cycle.

The Mundy cell has the advantages and disadvantages that one would expect of a dynamic memory design. The cell is quite dense and has fast current driven Read and Search operations. Due to its dynamic nature, however, it requires a word-by-word Read-Write refresh cycle. One of the major advantages of this design is that with its internal masking capability, it becomes a Functional Memory which can be exploited in intelligent memory systems.

DISCLOSURE OF THE INVENTION

In accordance with the present invention a memory cell comprises first and second storage transistors connected to first and second bit lines for comparing a potential stored on each transistor with a potential on each bit line. The first Write transistor is connected to the gate of the first Storage transistor and the second bitline. Conversely, the second Write transistor is connected to the gate of the second Storage transistor and the first bitline. This cross coupling of the storage and Write transistors to the bit lines results in storage of a high potential on the gate of a storage transistor which has its source at a low potential. The resultant higher gate-to-substrate capacitance of the storage transistor minimizes the drop in stored potential due to capacitive coupling to the Write line when the Write line is returned low. Further, since the source of the storage transistor is at a low potential, the possibility of capacitively coupling a high stored potential through the bitline to a lower potential has been removed. The increase in the storage capacitance increases the amount of charge stored which increases the storage time and leads to higher reliability and improved immunization to alpha particles.

A specific memory cell includes a match line, two bit lines and a Write line. A first IGFET storage transistor is connected between a first bitline and the Match line. A second IGFET storage transistor is connected between the second bitline and the Match line. A first IGFET Write transistor is connected between the gate of the first storage transistor and the second bitline with its gate connected to the Write line. A second Write transistor is connected between the gate of the second storage transistor and the first bitline with its gate connected to the Write line.

The preferred memory cell is fabricated in three primary levels. The source, drain and channel of each FET are formed in a lower level of semiconductor material. The Match and Write lines and the gate of the FETs are formed in a center level of conductive material. The center level and lower level are separated by gate insulating material at each transistor gate and the two layers are coupled by buried contacts at the connections between the storage transistor gates and the write transistor drains. The bitlines are formed in an upper level of conductive material which is insulated from the center level. The bitlines are coupled to the semiconductor of the lower level at each connection between the bitlines and each of the FETs.

BRIEF DESCRIPTION OF THE DRAWINGS

The foregoing and other objects, features and advantages of the invention will be apparent from the following more particular description of a preferred embodiment of the invention, as illustrated in the accompanying drawings in which like reference characters refer to the same parts throughout the different views. The drawings are not necessarily to scale, emphasis instead being placed on illustrating the principles of the invention.

FIG. 1 is a schematic illustration of a simple memory array comprising two three-bit words to illustrate use of the memory cell;

FIG. 2 is a schematic illustration of the prior art Mundy memory cell;

FIG. 3 is a schematic illustration of a memory cell embodying the present invention;

DESCRIPTION OF PREFERRED EMBODIMENTS

Figure 4:
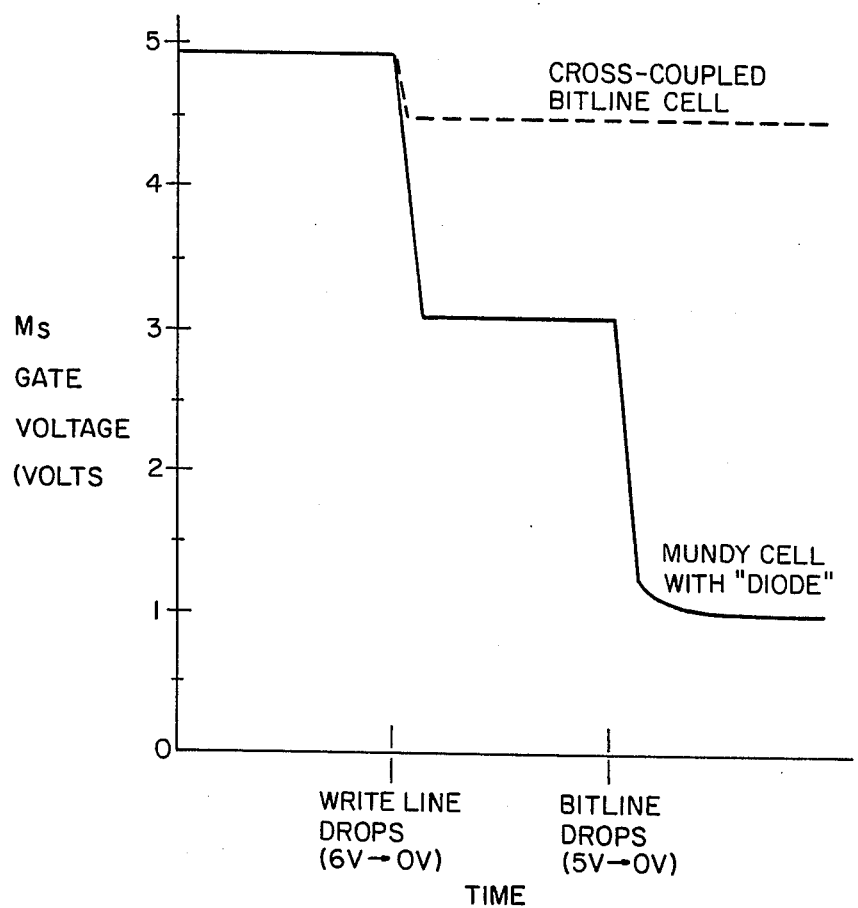
FIG. 4 is a comparison of the storage node voltage during the Write cycle for the memory cells of FIGS. 2 and 3.

FIG. 1 illustrates a simple two-word, three-bit memory in which the memory cell of the present invention may be used. The six cells of this memory array form two vertically stacked words of three laterally disposed bits. Although in practice a typical memory array would consist of many more words containing a larger number of bits, this example will illustrate the use of the cell.

Each cell may be set to one of three states, a "1", a "0" or a "don't care". These states are established during a Write cycle for each word by placing a high signal on the Write line for that word and by placing the appropriate inputs on the six bitlines 12. During the Write cycle, all bitline inputs are enabled by a bank of FETs 14. The address of the word into which the information is being written is established by a high signal on one of the Write lines 16. The "1" state may, for example, be designated by high and low inputs to that particular cell; a "0" state may be designated by low and high inputs to the cell; and a "don't care" state may be designated by two low inputs to the cell.

During a refresh cycle in which the bits stored in a word are read and rewritten into the dynamic memory cells, the stored states are read from the bit lines 12 through sense amplifiers 20. The particular word being read is determined by the match inputs through FETs 22 and 24.

During a search operation, a word is applied to the bitline inputs 12 and simultaneously compared to all of the stored words. Match lines for all words are enabled by the FETs 22 and 24. Where a stored word is determined to be the same as the input word, or different only by "don't care" bits, the Match line for that word remains high. Where a mismatch is detected, the Match line is pulled low. The match outputs are detected by sense amplifiers 26. Whereas a stored "don't care" may be indicated by two stored lows, a presented "don't care" during a match operation may be indicated by two high signals on the two bit lines.

A memory cell which provides the required functions for a content addressable memory using only four transistor elements is illustrated in FIG. 2. Two storage transistors $M_{S1}$ and $M_{S0}$ are connected drain-to-source between the Match line and respective bitlines. For reasons discussed below, an FET MD is connected as a diode between the Match line and the common drain of the FETs $M_{S1}$ and $M_{S0}$.

A "1", "0" or "don't care" is stored as charge on the gates of the storage transistors. This charge is stored during a Write cycle by respective Write transistors $M_{W1}$ and $M_{W0}$ connected between drain-to-source between the gates of the storage transistors and the respective bitlines. The two Write transistors are gated on by a high signal on the Write line. To store a "1" in the memory cell, a high signal is applied to bit 1 and a low signal to bit 0. With the two Write transistors gated on by the Write line, the high potential on bitline 1 charges the gate of the FET $M_{S1}$ through the Write transistor $M_{W1}$. Similarly, the low signal on bitline 0 causes the gate of storage transistor $M_{S0}$ to discharge through the Write transistor $M_{W0}$. When the Write transistors are then turned off by a low signal on the Write line 16, the charge then is isolated on the gates of the storage transistors.

The memory cell can be read by addressing the cell with a high signal on the Match line and low signals on the bitlines. If a high potential is stored on the gate of a storage transistor, that transistor is "on" and current flow from the high Match line to the low bitline and can be detected by a sense amplifier 20. On the other hand, if a low potential is stored on the storage transistor, the transistor is off and no current flows from the Match line to the bitline. The state of the cell is not destroyed by the Read cycle.

During a search operation, the Match line is held high for all words and the bit pattern being searched for is applied to the bitlines. If a high potential is stored on a the gate of a $M_W$ transistor, so that the transistor is "on", and a like high signal is applied to that transistor from the bitline, there is no current flow through the transistor because of the high potential at both the source and the drain of the FET. If the stored potential is low, the transistor remains "off" regardless of the potential applied on the bitline. If, however, the stored potential is high and a low level is applied to the bitline of that transistor, a mismatch condition is detected by current flow from the Match line through the transistor to the bitline. This mismatch can be sensed by the sense amplifier 26 as a drop in potential. A match is indicated on a Match line only if no bit within a word has a mismatch which draws current from the Match line.

It can be seen, then, that if the high/low input on the bitlines matches the high/low storage potentials, no current is drawn through the cell and a match is detected. Similarly, low/high bit signals compared to low/high stored signals result in a match. However, a high/low comparison to a low/high results in current flow through the "on" transistor to the low bitline. A "don't care" state can be established in the memory cell by pulling the gates of both storage transistors low during the Write cycle so that neither will turn "on" to discharge the Match line during a search operation. On the other hand, a "don't care" can be presented to the memory cell during a search operation by setting both bitlines high so that no current flows from the Match line regardless of the stored charges.

The FET $M_D$ is in a diode configuration with its gate connected to its drain. It is not required for operation of the single memory cell but it is important in minimizing sneak current paths between memory cells of an array. If the Match line were directly coupled to the drains of the storage transistors, a transistor which draws current in a mismatch situation might draw current through an FET from another bitline connected to the same match line. For example, current might flow from a high bitline through a storage transistor of an adjacent cell which is turned "on", through the Match line, and down through the storage transistor to a mismatched low bitline. This results in excessive current flow and reduced voltage swing on the Match line. The diode connected between the Match line and the storage transistors prevents the reverse current flow through the adjacent memory cell.

Another way to avoid the problem of sneak current paths between memory cells is to use a low input impedance transresistance amplifier to sense the Match line. This would keep the Match line voltage from moving enough to turn on the transistor which is presented with a high potential on its bitline. In that case the diode $M_D$ would not be required.

Although the memory cell presented in FIG. 2 is quite dense, it suffers from a small noise margin between a stored "1" and "0".

During a Write operation, a high potential is stored on the relatively small gate-to-substrate capacitance of an "off" transistor due to $C_{OX}$ being in series with a depletion capacitance. The storage node at the gate of the storage transistor is capacitively coupled through the overlap capacitance of the Write transistor to the Write line. Thus, as the Write line drops at the end of a Write cycle, the stored voltage is coupled down towards a low potential. Since the gate capacitance of an "off" transistor is very small, the stored potential is greatly affected by the capacitive coupling. Further, in the case of a mismatch during a search cycle, the potential of the bitline goes low, which pulls the stored potential even lower by way of capacitive coupling through the gate-to-source capacitance of the storage transistor.

The result of the two-fold capacitive coupling can be seen in FIG. 4. During the Write cycle, a high potential of about five volts is stored on the gate of the storage transistor. At the end of the Write cycle, the transition to low on the Write line pulls the stored potential down through the capacitive coupling due to the gate overlap capacitance of the Write transistor. Finally, the bitline goes low during a mismatch condition, pulling the stored potential even lower through the capacitive coupling of the gate-to-source capacitance of the storage transistor. This final low potential may be insufficient to turn the storage transistor "on" so a mismatch may not be recognized. At a minimum, it results in slower Search operation, the need for a more frequent Refresh, and larger area requirements for the storage capacitance to avoid soft error problems. Modern scaled fabrication processes with thin gate dielectrics and lightly doped substrates greatly exacerbate this problem.

One solution to the presented problem is to increase the parasitic gate-to-substrate capacitance of the storage device so that a larger charge is stored at the initial five volt potential. The potential would then be less affected by the capacitively coupled lower potentials. This approach results in larger area requirements for the device.

The approach presented by the present invention is illustrated in FIG. 3. In this memory cell, the two storage transistors and two Write transistors are provided as before. However, the sources of the Write transistors are cross coupled to the opposite bit lines. Thus, to store high/low potentials, the signal applied to the bitlines during the Write cycle is low/high. When, for example, a high potential is applied through $M_{W1}$ from the bitline 0 to charge the gate of $M_{S1}$ during a Write cycle, the signal on bitline 1 would be low to discharge the gate of the storage transistor $M_{S0}$. The large potential difference between the gate and source of $M_{S1}$ provides an inversion layer which results in an increased gate capacitance about equal to $C_{OX}$. That increased capacitance during the Write cycle results in a larger stored charge. Then, when the signal on the Write line returns low, the stored potential obtained with a larger stored charge is less affected by a capacitively coupled low transition on the Write line. This is illustrated by the broken line of FIG. 4. Finally, because charge is stored while a low potential is presented to the storage transistor's source, the stored potential cannot be capacitively coupled any lower by the bitline during a mismatch. Thus, the gate voltage remains high even with a mismatch during the search operation and there is no additional voltage loss due to capacitive coupling to the bitline.

Except for the fact that the Write operation requires the signals on the bitlines to be interchanged due to the cross-coupling, the memory cell of FIG. 3 operates in the same manner as that of FIG. 2. The advantages of the present system are lost if one attempts to store two high signals, but that fourth state is generally not required.

Matching is accomplished by raising the bitlines to a high potential, precharging the Match line to a high potential, and then driving the bitlines to the desired logic levels. If a bitline is lowered on a branch where a high potential is stored, current flows through the "on" $M_S$ transistor to discharge the Match line, and a mismatch is detected. If the bitlines connected to each of the "on" transistors remains high, no current flows and a match is indicated. A "don't care" can be externally presented to the cell if both bitlines remain high, which prevents the Match line from being discharged. If a "don't care" has been stored, both $M_S$ transistors are "off" and no discharge path exists regardless of the presented potentials on the bitlines. Addressed reading is done by discharging the bitlines to ground and then raising the potential of the Match line of the word of interest. The potential of a bitline rises if the $M_S$ transistor in the selected word has a high potential stored on its gate.

Figure 5:
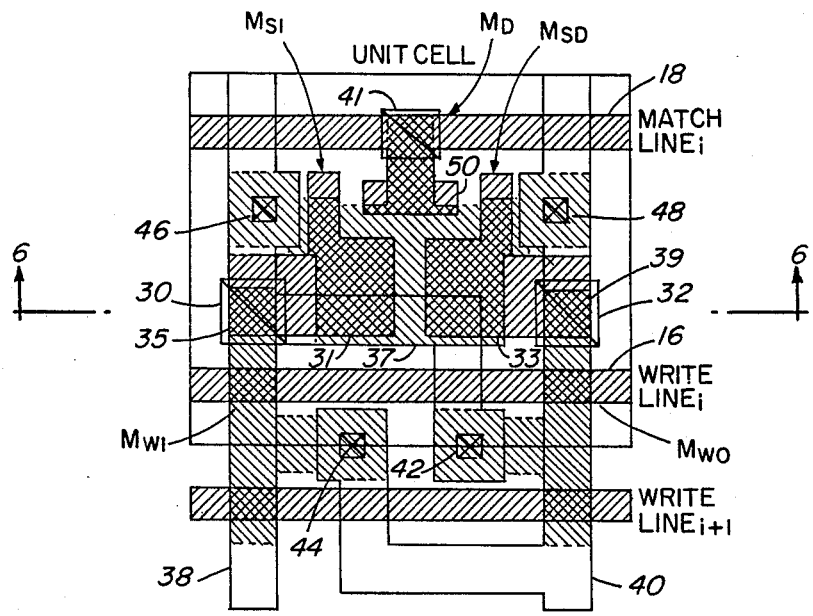
FIG. 5 is a mask layout for fabricating the memory cell of FIG. 3.
Figure 6:
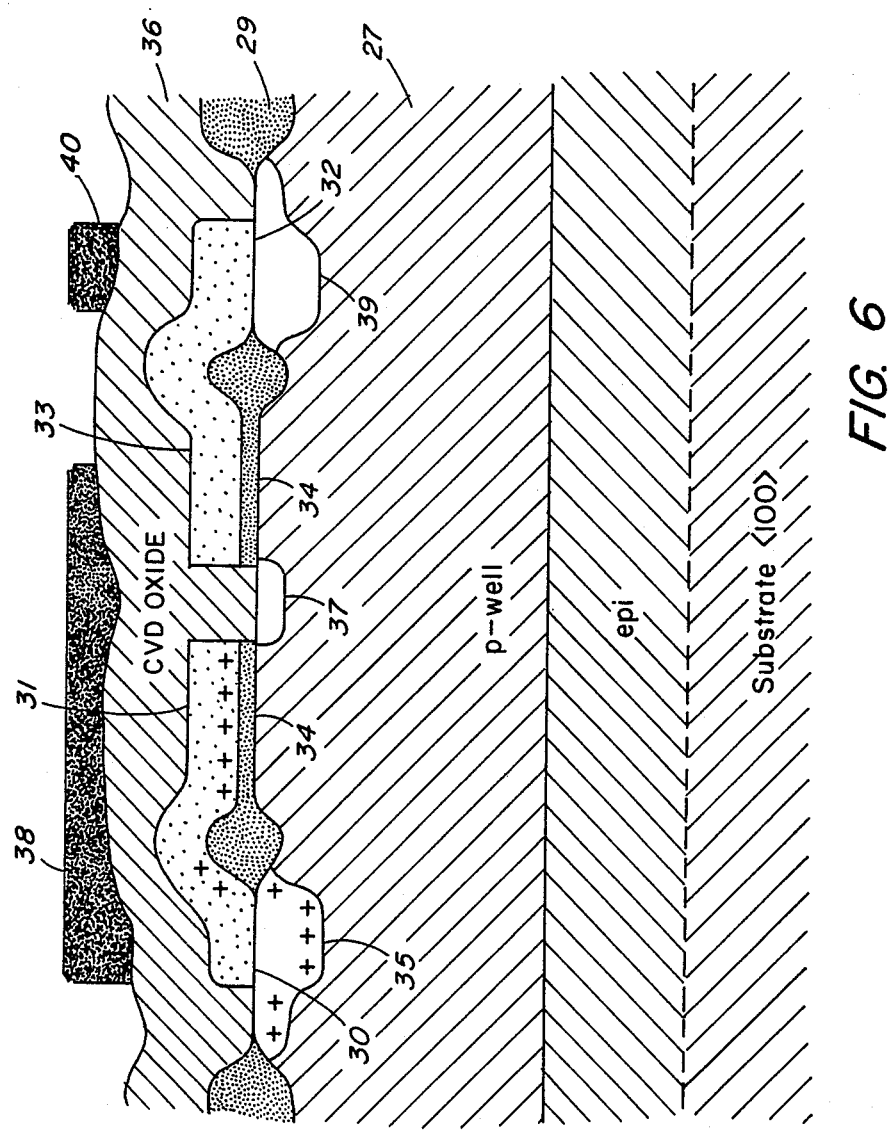
FIG. 6 is a cross sectional view of the memory cell taken along a line corresponding to line 6—6 of FIG. 5.

A preferred mask layout for fabricating the memory cell is illustrated in FIG. 5 for a circuit structure illustrated in FIG. 6. The memory cell is fabricated in three primary levels. A lower semiconductor level, a level of polysilicon lines and gates and a level of metal bitlines. Visualize FIG. 5 in three dimensions with the dotted diffusion layer in a lower semiconductor level, the cross hatched polysilicon in the middle level and the metal in the upper level. Buried connections and FET gates are provided at the intersections of the polysilicon and diffusion masks. FIG. 6 is a cross section of the thus visualized device across lines 6—6.

At the lower level, the source, drain and channel of each FET are formed in semiconductor material. The source and drain are formed by diffusion of arsenic into the semiconductor material, which is of p type for an n-type device. The diffusion mask is illustrated by the array of dots in the layout of FIG. 5. Diffused regions are provided in those areas where the diffusion mask does not overlie the polysilicon mask. Conductive silicided polysilicon is provided in a middle level. Where the polysilicon forms transistor gates, thin layers of silicon dioxide 43 provide the gate insulation. As shown in FIG. 6, the channels of the storage transistors $M_{S1}$ and $M_{S1}$ are below the polysilicon gates 31 and 33 between the diffusion regions 35 and 37 and 37 and 39. Buried contacts are provided between the polysilicon conductors and the semiconductor layer at connections between the storage transistor gates and the Write transistor drains 30 and 32. Such a buried contact is also provided at 41 (FIG. 5) where the gate of $M_D$ is coupled to its drain.

The conductive bitlines are provided in metal of an upper level separated from the other levels by a layer of CVD oxide 36. The two bitlines 38 and 40 run orthogonal to the Write lines 16. Contact is made through the CVD oxide layer 36 to the diffused regions of the semiconductor at the sources of the Write transistors 42 and 44 and the sources of the storage transistors 46 and 48.

The bitline 38 is cross coupled to a metal-to-semiconductor contact at 42 at the source of $M_{W0}$. The contacted diffusion layer passes to the Write line 16 which provides the gate of $M_{W0}$ and there serves as a source. A diffusion region continues as the drain of $M_{W0}$ at the opposite side of the Write line to a connection at 32 to the polysilicon gate of $M_{S0}$. Separate diffusion regions are provided from the source connection of $M_{S0}$ at 48, from the source connection of $M_{S1}$ at 46 and at the common drain 37 between the storage transistor gates 31 and 33. A gate 50 is provided over the diode connected FET $M_D$.

Similarly, the bitline 40 is connected through contact 44 to a diffusion region in the lower level which passes to the polysilicon Write line 16 to form the source of the Write transistor $M_{W1}$. A drain diffusion region makes contact at 30 with the gate of the storage transistor $M_{S1}$.

The formation of the Match and Write lines with the same material as the FET gates and the buried contacts between the semiconductor and polysilicon allow for miniaturization of the memory cell. The lower conductivity polysilicon is suitable for the shorter Write and Match lines and those polysilicon lines do not require special contacts to the polysilicon gates. The longer bitlines are of higher conductivity metal, and in the upper level they are able to overlie the Write FETs and their buried contacts to minimize the space requirements. From the layout of FIG. 5, using two micron design rules, a memory cell having the dimensions of 22 $\mu M$ by 25 $\mu M$ can be provided.

Figure 7:
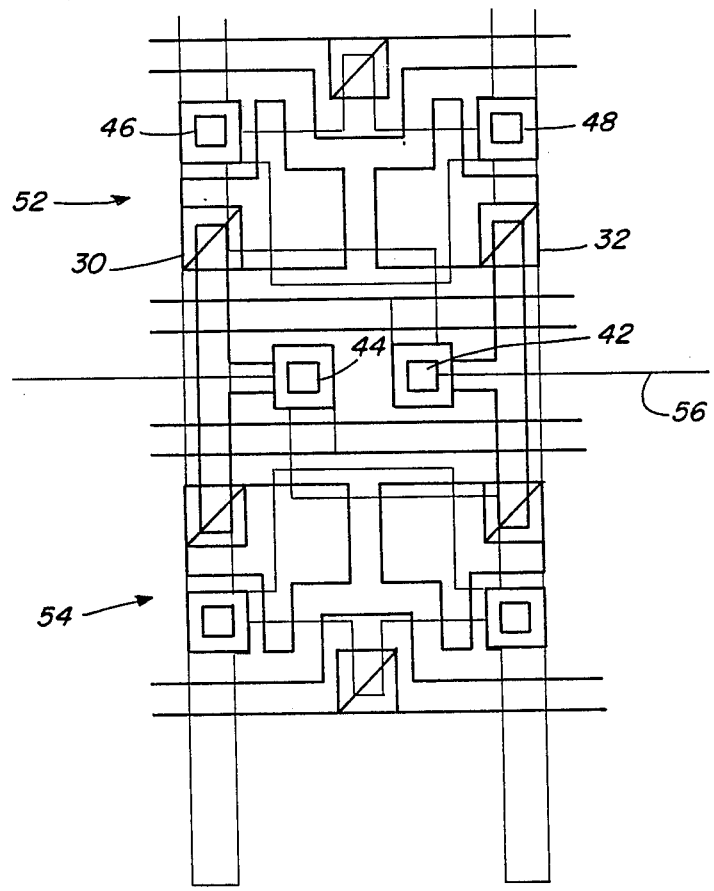
FIG. 7 shows the mask layout of two side-by-side memory cells.

The effective area of each memory cell is minimized by sharing the metal contacts between the gates of the Write transistors and the bitlines. FIG. 7 shows layouts of two memory cells. It can be seen that the two memory cells are laid out as mirror images to each other about a line 56 passing through the metal contacts 44 and 42. Those metal contacts are shared by the two memory cells.

The term drain has been applied to the uppermost portions of the transistors as viewed in FIGS. 2 and 3. However, it will be recognized that the source and drain designations on a transistor are dependent on the presented potentials and may be reversed for different modes of operation. Thus, those terms should not be considered as limiting the nature of the devices.

While the invention has been particularly shown and described with reference to a preferred embodiment thereof, it will be understood by those skilled in the art that various changes in form and details may be made therein without departing from the spirit and scope of the invention as defined by the appended claims.

We claim:

1. A content addressable dynamic memory cell comprising:
   a first storage transistor connected to a first bitline for comparing a potential stored on the first storage transistor with a potential presented on the first bitline;
   a second storage transistor connected to a second bitline for comparing a potential stored on the second storage transistor with a potential presented on the second bitline;
   a first Write transistor connected to store a potential, presented on the second bitline, onto the first storage transistor; and
   a second Write transistor connected to store a potential, presented on the first bitline, onto the second storage transistor.

2. A memory as claimed in claim 1 wherein the transistors are insulated gate field effect transistor devices.

3. A content addressable dynamic memory cell comprising:
- a Match line, first and second bit lines and a Write line;
- a first storage transistor connected between the first bitline and the Match line;
- a second storage transistor connected between the second bitline and the Match line;
- a first Write transistor connected between the gate of the first storage transistor and the second bitline with its gate connected to the Write line; and
- a second Write transistor connected between the gate of the second storage transistor and the first bitline with its gate connected to the Write line.

4. A memory as claimed in claim 3 wherein the transistors are insulated gate field effect transistors (FETS).

5. A memory cell as claimed in claim 4 fabricated in three primary levels:
- a lower level of semiconductor material in which the source, drain and channel of each FET are formed;
- a center level of conductive material in which the match and Write lines and the gate of each FET are formed, the center level and lower level being separated by gate insulating material at each transistor gate and the center level and lower level being coupled at buried contacts at the connections between the storage transistor gates and the Write transistors; and
- an upper level in which bitlines of conductive material are formed with the bitlines insulated from the center level but coupled to the lower level at each connection between the bitlines and each of the FETs.

6. A memory cell as claimed in claim 5 wherein the conductive material of the center level is polysilicon and the conductive material of the upper level is metal.

7. A memory cell as claimed in claim 5 further comprising a buried contact between material of the center level forming the Match line and the gate of a diode connected FET and a region of the lower level forming the drain of the diode connected FET.

8. A memory cell as claimed in claim 5 wherein the connections between the bitlines of the upper level to the Write transistors in the lower level are shared by adjacent memory cells.

9. A memory cell as claimed in claim 3 further comprising a diode connected between the Match line and the storage transistors.

10. A memory cell as claimed in claim 3 able to be read by applying potentials to the Match line and bitlines which can cause current flow through one of the storage transistors.

11. A memory cell as claimed in claim 10 wherein data is stored in the memory cell as a charge on the gate of one of the storage transistors, the charge being stored solely due to the capacitance at the gate of the storage transistor.

12. A memory cell as claimed in claim 3 wherein data is stored in the memory cell as a charge on the gate of one of the storage transistors, the charge being stored solely due to the capacitance at the data of the storage transistor.

13. A memory cell as claimed in claim 1 wherein the first and second storage transistors are coupled between respective first and second bitlines and a common node, and the memory cell is able to be read by applying potentials to the common node and the respective bitlines which can cause a current flow through one of the storage transistors.

14. A memory cell as claimed in claim 13 wherein data is stored in the memory cell as a charge on the gate of one of the storage transistors, the charge being stored solely due to the capacitance at the gate of the storage transistor.

15. A memory cell as claimed in claim 1 wherein the data is stored in the memory cell as a charge on the gate of one of the storage transistors, the charge being stored solely due to the capacitance at the gate of the storage transistor.

* * * * *